US006448625B1

(12) United States Patent
Hossain et al.

(10) Patent No.: US 6,448,625 B1
(45) Date of Patent: Sep. 10, 2002

(54) HIGH VOLTAGE METAL OXIDE DEVICE WITH ENHANCED WELL REGION

(75) Inventors: Zia Hossain, Tempe, AZ (US); Evgueniy N. Stefanov, Vieille Toulouse (FR); Mohammed Tanvir Quddus, Tempe, AZ (US); Joe Fulton, Chandler, AZ (US); Mohamed Imam, Tempe, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/808,966

(22) Filed: Mar. 16, 2001

(51) Int. Cl.[7] ................................................ H01L 23/58
(52) U.S. Cl. ....................................................... 257/493
(58) Field of Search ................................ 257/355, 409, 257/492, 493, 496

(56) References Cited

U.S. PATENT DOCUMENTS 5,272,098 A * 12/1993 Smayling et al.
5,569,937 A * 10/1996 Bhatnagar et al.
5,610,432 A * 3/1997 Ludikhuize
5,894,156 A * 4/1999 Terashima et al.
6,160,290 A * 12/2000 Pendharkar et al.
6,207,994 B1 * 3/2001 Rumennik et al.
6,242,787 B1 * 6/2001 Nakayama et al.

* cited by examiner

*Primary Examiner*—Keith Christianson

(57) ABSTRACT

A high voltage MOS device (100) is disclosed. The MOS device comprises an n-well region (113) with two areas. The first area (110) has a high dopant concentration and the second area (112) has a low dopant concentration. Inside the well region a region of a secondary conductivity type (108) is formed. The second area (110) is typically underlying a gate (105). The lower doping concentration in that area helps to increase the breakdown voltage when the device is blocking voltage and helps to decrease on-resistance when the device is in the "on" state.

15 Claims, 5 Drawing Sheets

HIGH VOLTAGE METAL OXIDE DEVICE WITH ENHANCED WELL REGION

FIELD OF THE INVENTION

The present invention relates to semiconductor MOS devices and more specifically to a high voltage metal oxide device with an enhanced n-well region.

BACKGROUND OF THE INVENTION

When designing high voltage metal oxide (MOS) devices two criteria must be kept in mind. First, the device should have a very high breakdown voltage ($V_{BD}$). Second, the device, when operating, should have as low an on-resistance ($RDS_{ON}$) as possible. One problem is that techniques and structures that tend to maximize $V_{BD}$ tend to adversely affect $RDS_{ON}$ and vice versa.

To overcome this problem, different designs have been proposed to form devices with acceptable combinations of $V_{BD}$ and $RDS_{ON}$. One such family of devices is fabricated according to the reduced surface field (RESURF) principal. These devices utilize an extended drain region (in one embodiment a n-well) to support high off-state voltage ($V_{BD}$). These devices have a maximum number of charges in the drain area of about $1\times10^{12}\text{cm}^{-2}$ before avalanche breakdown occurs. This maximum charge sets up the lowest $RDS_{ON}$ possible since $RDS_{ON}$ is proportional to the charge in the drain region.

To help alleviate this problem, some devices utilize a top layer of a conductivity type opposite the extended drain region (in one embodiment a p-type layer) inside the drain region. The top layer allows for a drain region having approximately double the charge than previous designs, which decreases the $RDS_{ON}$. The top layer helps to deplete the extended drain when the extended drain is supporting high voltage, thus allowing for high breakdown voltage.

One drawback to this approach is that a high drain concentration under the gate region and adjacent to the channel region can lead to premature breakdown when the device is blocking voltage. Thus, what is needed is a drain region that has a high concentration in most areas but provides for lower concentration under a gate region.

BRIEF DESCRIPTION OF THE DRAWINGS

For a more complete understanding of the present invention and advantages thereof, reference is now made to the following descriptions, taken in conjunction with the following drawings, in which like reference numerals represent like parts, and in which.

DETAILED DESCRIPTION OF THE DRAWINGS

The present invention relates to high voltage metal oxide devices (MOS devices) that have a high breakdown voltage and low on resistance. While the discussion below concerns n-channel devices, the discussion also pertains to p-channel devices, which may be formed by reversing the conductivity of the described regions and layers.

Figure 1:
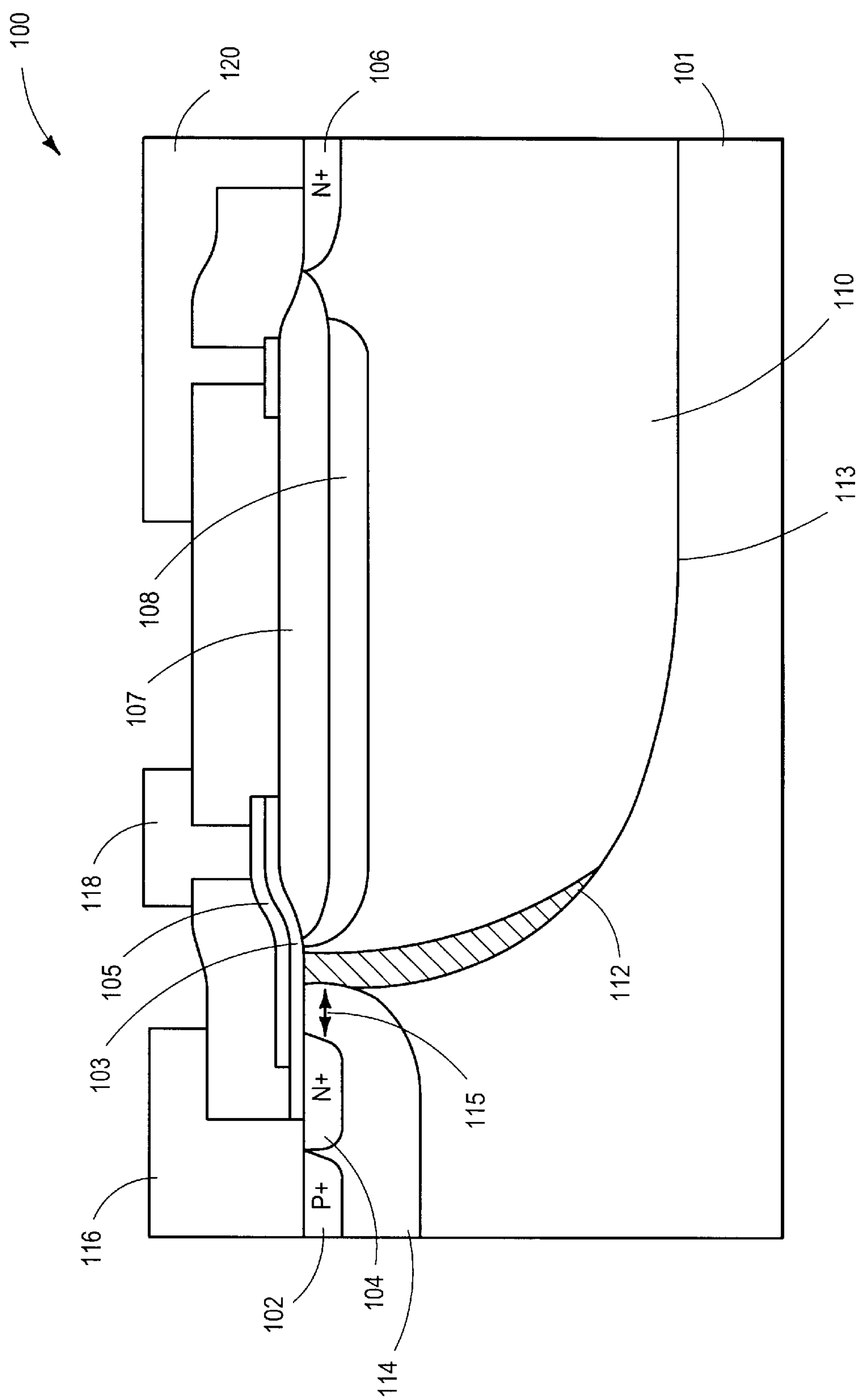
FIG. 1 is a cross-sectional side view of the device showing an enhanced n-well.

FIG. 1 illustrates an exemplary n-channel MOS device 100 showing an embodiment of the present invention. Illustrated is a lightly doped p-type substrate region 101. A N+ source diffusion region 104 is formed at the top of substrate region 101. A P+ diffusion region 102 is formed adjacent to N+ source diffusion region 104. The P+ diffusion region 102 increases the integrity of the source to substrate connection as well as reduces the device's susceptibility to parasitic bipolar effects. Associated with the N+ source region 104 and P+ region 102 is a source electrode 116, which provides electrical contact to the N+ source region 104 and P+ region 102.

An insulating layer 103 (comprising silicon dioxide or some other insulating dielectric material) is formed at the top of the substrate 101. Over the insulating layer is a gate 105, typically comprising silicon. A gate contact 118 is coupled to the gate 105.

A drain diffusion region 106 is formed at the top of substrate 101 away from source region 104 and connected electrically to drain contact 120. Drain contact 120 may comprise a number of conductive metals or metal alloys. An optional diffused P region 114 may be formed in the substrate 101 to enclose P+ region 102 and N+ source region 104. This diffused P region 114 is a lightly doped (high voltage) P-region (PHV) and helps to reduce the device's susceptibility to drain-to-source punch through as well as helps to provide an appropriate threshold voltage. A device including this region is known as a double diffused metal oxide, or DMOS, device. When the source contact and drain contact are on the same surface, the device is a lateral double diffused metal oxide or LDMOS device. A channel region 115 exists at the top of the substrate 101 from the N+ source region 104 to the end of the diffused region 114.

An n-well region 113 comprising a first region of high doping concentration 110 and second region of lower concentration 112 is formed in substrate 101 such that n-well region 113 extends from the surface of substrate 101 adjacent to the channel region 115 and into the substrate 101 and enclosing the drain region 106. N-well 113 is formed via performing a first n-well implant with a fairly light doping and then forming a second n-well implant inside first n-well implant but laterally offset towards the drain by a fixed amount. This process is shown in FIGS. 5 through 9. The second n-well implant has a much higher concentration of dopants. The combination of those two implants produces first region 110, where the concentration of dopants and, therefore, the charge, is very high. Second region 112 is formed from where the two implants do not overlap and the concentration of dopants is based on the doping of first n-well implant and the out diffusion of the second n-well implant.

In first region 110, in one embodiment, the number of charge can approach $2\times10^{12}\text{ cm}^{-2}$. P-top layer 108 is formed inside n-well 113 for charge balancing. P-top layer 108 may be located adjacent to the top of n-well 113 or implanted inside n-well 113. Alternatively, more than one p-top layer or layers 108 may be formed within n-well 113, which is discussed with more detail in FIG. 2. A surface p-top layer 108 allows for downward depletion when voltage is blocked. This, along with the upward depletion from the bottom of n-well 113, allows for a high breakdown voltage. The increased doping in the first n-well region 110 allows for lower on-resistance. A field oxide layer 107 is formed over n-well 113 to protect the n-well 113 from mobile contaminants. P-top layer 108 can be grounded or left floating.

A feature of the present invention is second region 112. Second region 112 is formed where the first n-well implant and the second n-well implant did not overlap. Second region 112 has a doping concentration based on the doping of the first n-well implant and the out diffusion of the second n-well implant. This provides a lighter doping in a region underlying the gate 105. The lighter doping in this region provides several advantages. This lighter doping region increases the depletion extension into the n-well region 113 and adjacent to diffused region 114, which helps prevent premature breakdown due to critical points of the electric field at the surface of the device. One such critical area is by the gate region adjacent to the channel region 115. Lower doping concentration in this area helps to increase the breakdown voltage when the device is blocking voltage ("off state"). Also, when the device is in the "on" state the surface of the light region becomes accumulated [as if a richer n-well is present] which helps to reduce $RDS_{ON}$.

Figure 2:
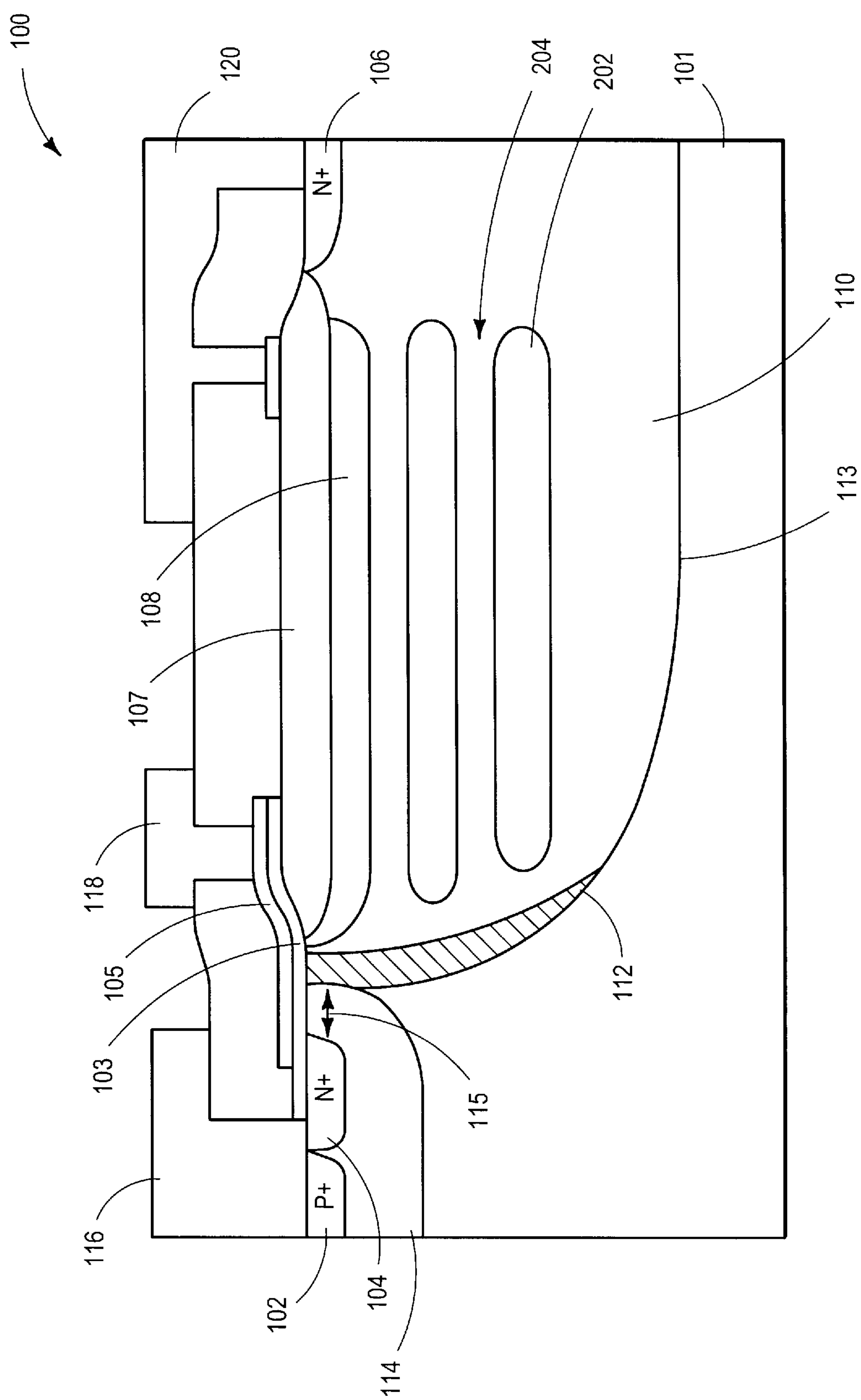
FIG. 2 is a cross-sectional side view of the device including multiple p-regions.

FIG. 2 is a cross-sectional side view of the device including multiple p-regions 202. Illustrated is device 100 with an n-well 113 comprising the first region of high concentration 110 offset from the second region of low concentration 112. Also, illustrated below p-top layer 108 are a plurality of p-regions 202 separated by conductivity channels 204. These p-regions 202 are formed, for example, by high-energy ion implantation. The conductivity channels 204 can each carry a large charge, which allows for a lower on-resistance.

Figure 3A:
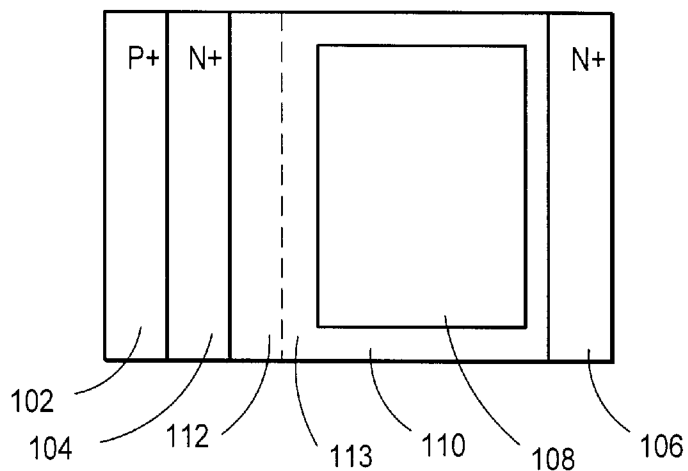
FIGS. 3*a*, 3*b* and 3*c* are top views of the device showing different alignments of the p-top layer.

FIG. 3*a* is a top view of device 100. Illustrated is the source region 104, the adjacent p-region 102, a drain region 106 and p-top layer 108, which, in this embodiment, is one solid p-top layer. P-top layer 108 overlies n-well 113, which, in this illustration overlies the first region 112 of lower concentration and a second region 110 of higher concentration. As discussed in conjunction with FIG. 2, there can be multiple p-regions under the p-top layer 108. P-top layer 108 also is not necessary at the top but can be below the surface of the n-well 113.

Figure 3B:
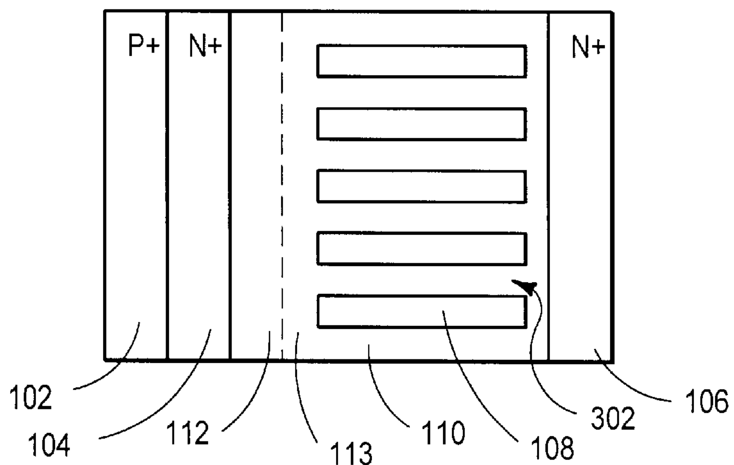
Figure 3C:
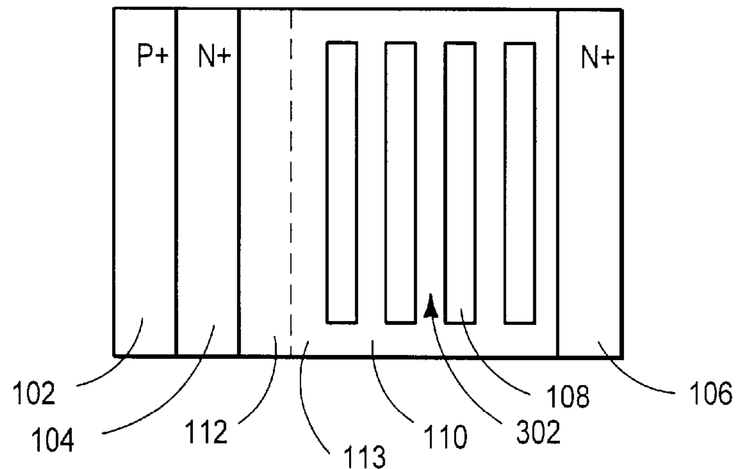

FIG. 3*b* represents the same device 100 with p-top layer 108 comprising multiple "stripes" of p-top material, each one separated by a channel region 302 which is parallel to current flow (current will flow from the source to the drain). FIG. 3*c* also illustrates n-well 113 having a first region of high dopant concentration 110 and a second region of lower dopant concentration 112. FIG. 3*c* is similar to FIG. 3*b* except the "stripes" of p-top material are aligned perpendicular to current flow. Again, n-well 113 is illustrated having a first region of high dopant concentration 110 and a second region of low dopant concentration 112. While "stripes" are shown in FIGS. 3*b* and 3*c*, other arrangements of the p-top layers 108 are possible, including individual islands shaped as circulars, squares or polygons.

Figure 4:
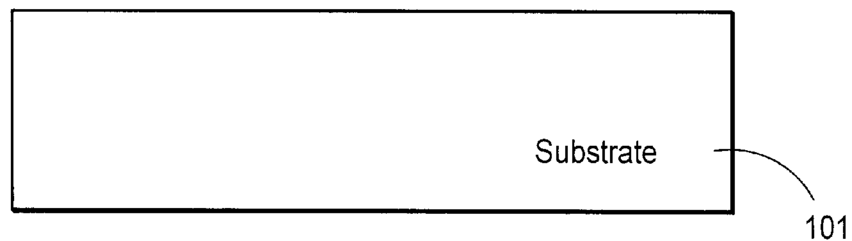
FIGS. 4 through 9 illustrate a method for manufacturing the device.
Figure 5:
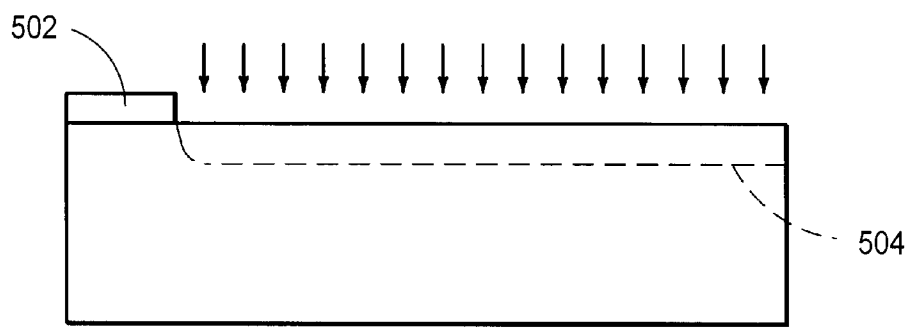
Figure 6:
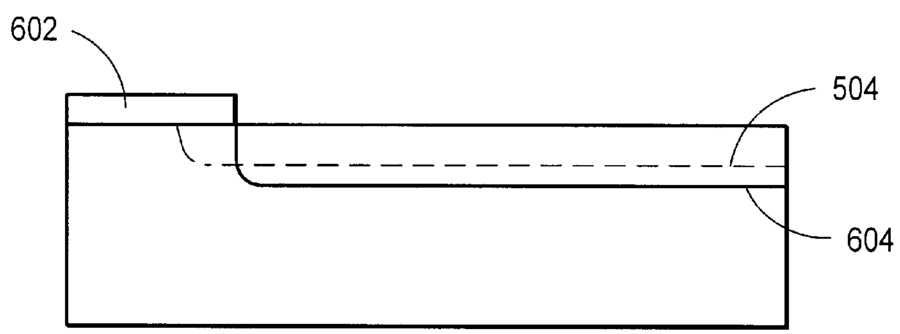

FIGS. 4 through 9 illustrate steps in an exemplary process to manufacture the present invention. These illustrations are for a half-cell. First, as shown in FIG. 4, a p substrate 101 is provided. Next, illustrated in FIG. 5, a first n-well implant is performed. In this step dopants are implanted through an opening first mask 502. The first implant is a low dose implant. Dotted line 504 shows the extent of the first n-well implant. Next, illustrated in FIG. 6, a second n-well implant is performed. In this step, dopants are implanted through an opening in a second mask 602. Second mask 602 is offset laterally from first mask 502. The second implant is a higher concentration implant. Solid line 604 shows the extent of the second n-well implant. The order of steps shown in FIGS. 5 and 6 can be interchanged.

Figure 7:
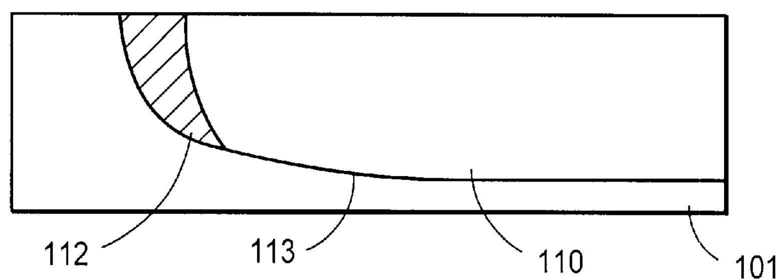

Next, as illustrated in FIG. 7, a heat cycle is performed to cause first n-well and second n-well to diffuse. Due to the fact the second n-well implant was offset from the first n-well implant, after diffusion an n-well region 110 with two distinct regions will be formed. In the offset region, the concentration of dopants is primarily due to the first implant, which was a low concentration implant. This forms a region of low concentration. In the area where the implants overlap, a region of high concentration is formed. N-well 113 is the combination of dotted line 504 and solid line 604 from FIG. 5 and FIG. 6.

Figure 8:
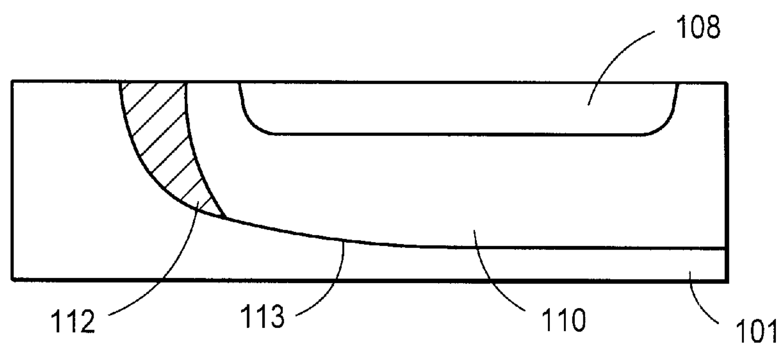

Next, as illustrated in FIG. 8, a p-top implant is performed through a mask opening. A heating cycle is performed to diffuse the p-top layer 108.

Figure 9:
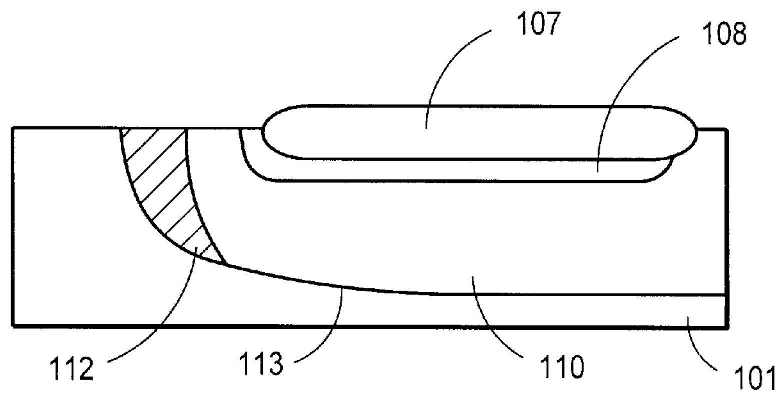

Then, a field oxide layer is formed over the p-top layer 108. This is illustrated in FIG. 9. In the remaining steps, the gate is formed. This is followed by the PHV implant and a drive step. Then, the p-region in the PHV region is formed along with the n-type source and regions. Then a source/drain anneal is completed. All other steps necessary to complete the device are performed. FIG. 1 illustrates the final device.

Thus, it is apparent that there has been provided, an improved semiconductor device. It should be understood that various changes, substitutions, and alterations are readily ascertainable and can be made herein without departing from the spirit and scope of the present invention as defined by the following claims.

What is claimed is:

1. A DMOS device comprising:

a substrate;

a well region of a first conductivity type formed in the substrate having a first area of high dopant concentration and a second area of low dopant concentration; and a first region of a second conductivity type formed inside the well region.

2. The device of claim 1, wherein the second area underlies a gate region.

3. The device of claim 1, wherein the well region is formed from two separate well implantation steps.

4. The device of claim 1, wherein the device includes a diffused region of a second conductivity type extending from the surface of the substrate and adjacent to the well region.

5. The device of claim 1, wherein the first region of a second conductivity type is formed at the top of the well region and one or more additional regions of a second conductivity type are formed under the first region, each region separated by a conductivity channel.

6. The device of claim 4, wherein a source region is formed within the diffused region.

7. The device of claim 1, further comprising a drain region formed within the well region.

8. A high voltage DMOS device comprising:

a first region of a first conductivity type formed in a substrate, the region comprising:

a first area of high dopant concentration;

a second area of low dopant concentrations, wherein the second area is laterally offset from the first area;

a second region of a second conductivity type formed in the first region;

a drain region formed within the first region;

a third region of the second conductivity type, the third region a lightly doped, high voltage region; and a source region formed within the third region.

9. The device of claim 8, wherein the first region is formed by a first implant of low dopant concentration followed by a second implant of high dopant concentration, the second implant laterally offset from the first implant.

10. The device of claim 8, further comprising multiple regions of a second conductivity type formed in the first region, each region separated by a conductivity channel.

11. The device of claim 8, wherein the second area underlies a gate region.

12. A DMOS device comprising:

a substrate of a first conductivity type;

a well region formed by implanting a first area of high dopant concentration of a second conductivity type and a second area of low dopant concentration of a second conductivity type into the substrate; and a first region formed by implanting impurities of a first conductivity type into the well region.

13. The device of claim 12, wherein the second area is formed adjacent to a channel region.

14. The device of claim 12, wherein the first region is formed below a top portion of the well region by implanting impurities using a high energy implantation.

15. The device of claim 12, wherein multiple regions of the first conductivity type are formed by multiple implantation steps, each step implanting impurities at different energy levels.

* * * * *